(12) United States Patent
Papasouliotis et al.

(10) Patent No.: US 8,507,372 B2
(45) Date of Patent: Aug. 13, 2013

(54) METHOD FOR PROCESSING A SUBSTRATE HAVING A NON-PLANAR SUBSTRATE SURFACE

(75) Inventors: George D. Papasouliotis, North Andover, MA (US); Vikram Singh, North Andover, MA (US); Heyun Yin, Saugus, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/480,204

(22) Filed: May 24, 2012

(65) Prior Publication Data

US 2012/0295430 A1 Nov. 22, 2012

Related U.S. Application Data

(63) Continuation of application No. 12/765,346, filed on Apr. 22, 2010, now Pat. No. 8,202,792.

(60) Provisional application No. 61/172,365, filed on Apr. 24, 2009.

(51) Int. Cl.
*H01L 21/425* (2006.01)

(52) U.S. Cl.
USPC ................... 438/527; 257/E21.334

(58) Field of Classification Search
USPC ................... 438/514, 525, 527, 513
See application file for complete search history.

(56) References Cited

U.S. PATENT DOCUMENTS

| | | | | |
|---|---|---|---|---|
| 8,034,689 B2 * | 10/2011 | Lenoble et al. | | 438/283 |
| 8,039,349 B2 * | 10/2011 | Hargrove et al. | | 438/275 |
| 8,202,792 B2 * | 6/2012 | Papasouliotis et al. | | 438/527 |
| 8,298,925 B2 * | 10/2012 | Wu et al. | | 438/513 |

* cited by examiner

*Primary Examiner* — Charles Garber
*Assistant Examiner* — Reema Patel

(57) ABSTRACT

A technique for conformal processing of a substrate having a non-planar surface is disclosed. The technique includes several stages. In a first stage, some surfaces of the substrate are effectively processed. During a second stage, these surfaces are treated to limit or eliminate further processing of these surfaces. During a third stage, other surfaces of the substrate are processed. In some applications, the surfaces that are perpendicular, or substantially perpendicular to the flow of particles are processed in the first and second stages, while other surfaces are processed in the third stage. In some embodiments, the second stage includes the deposition of a film on the substrate.

17 Claims, 7 Drawing Sheets

EFFECT OF O₂ TREATMENT ON RETAINED DOSE (BY SIMS) OF AsH₃ IMPLANTS.

METHOD FOR PROCESSING A SUBSTRATE HAVING A NON-PLANAR SUBSTRATE SURFACE

PRIORITY

This application is a continuation application of and claims priority to U.S. patent application Ser. No. 12/765,346, filed on Apr. 22, 2010, and entitled "Method Of Processing A Substrate Having A Non-Planar Surface," which is a non-provisional application of and claims priority to U.S. Provisional Patent Application Ser. No. 61/172,365, filed on Apr. 24, 2009, and entitled "Method Of Processing A Substrate Having A Non-Planar Surface." Each of U.S. Provisional Patent Application Ser. No. 61/172,365 and U.S. patent application Ser. No. 12/765,346 is incorporated in its entirety by reference.

FIELD

The present disclosure relates to a method for processing a substrate having a non-planar surface.

BACKGROUND

In manufacturing advanced devices, it may be necessary to process a substrate having a non-planar surface. Examples of such devices include three dimensional (3D) FinFETs having raised fins with horizontally and vertically oriented surface sections, and CMOS image sensors (CIS) and eDRAMs each of which has trenches with horizontally and vertically oriented surface sections. One of the techniques used to process such a substrate may include doping to modify electrical, mechanical, optical, and thermal properties, or a combination of such properties, of the original substrate. The source/drain (SD) regions of FinFETs, sidewall of shallow trenches in CMOS image sensors, and sidewall of deep trenches (DT) in eDRAMs may be doped to modify the properties of the substrates.

The doping technique may be performed via an ion implantation, a particle based step. In an ion implantation, ions are generated in an ion source. Thereafter, ions are directed toward a substrate located downstream of the ion source at a single, uniform or substantially uniform angle. The ions are then incident on the substrate surface and process the substrate.

The ion implantation techniques, whether for planar or non-planar substrate, are line-of-sight techniques. The surface sections perpendicular or substantially perpendicular to the incident angle of the ions are sufficiently exposed and processed effectively. Other surface sections oriented at another angle, however, may not be exposed as sufficiently, and the surface may not be processed as effectively. In a plasma based doping technique, for example, a region of the substrate near the surface sections perpendicular or substantially perpendicular to the ion flux may be doped at much higher dose (e.g. up to 10 to 100 times) than other regions near the surface sections parallel to the ion flux. As a result, a non-conformal processing may occur. Such a variation in processing may result in substrates with non-uniform properties, and the final devices may not operate optimally.

As the advanced devices require uniform properties, it may be desirable for the techniques to conformally process surfaces oriented in different angles. In the doping techniques, for example, it may be desirable to achieve equal or substantially equal dopant concentration in the regions near the differently oriented surface sections. Although numerous techniques have been proposed, the proposed techniques achieved limited success. Accordingly, a new technique is needed.

SUMMARY

A technique for conformal processing of a substrate having a non-planar surface is disclosed. The technique includes several stages. In a first stage, some surfaces of the substrate are effectively processed. During a second stage, these surfaces are treated to limit or eliminate further processing of these surfaces. During a third stage, other surfaces of the substrate are processed. In some applications, the surfaces that are perpendicular, or substantially perpendicular to the flow of particles are processed in the first and second stages, while other surfaces are processed in the third stage. In some embodiments, the second stage includes the deposition of a film on the substrate.

BRIEF DESCRIPTION OF DRAWINGS

For a better understanding of the present disclosure, reference is made to the accompanying drawings, in which like elements are referenced with like numerals, and in which.

DETAILED DESCRIPTION

Figure 1A:
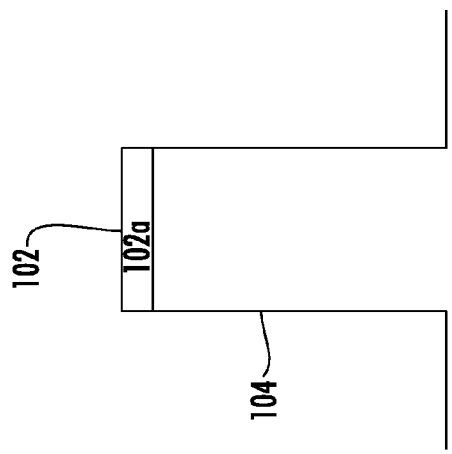
FIGS. 1*a-d* represent a series of steps for processing a substrate with a non-planar surface according to one embodiment.

In the present disclosure, several embodiments of a novel technique for processing a substrate with non-planar surfaces are introduced. For purpose of clarity and simplicity, the embodiments will be described in context to a system and process where a substrate is processed as one or more processing agents are incident on the substrate. Particular example of systems and the process may include plasma based systems and techniques, where the processing agents include charged particles. The particles in the present disclosure may refer to subatomic, atomic, or molecular based particles including, photon, phonon, electron, proton, neutron, ions, gas clusters etc . . . . Systems and processes that do not necessarily involve plasma such as, for example, chemical vapor deposition (CVD) technique, an atomic layer deposition (ALD) technique, molecular beam epitaxy (MBE) technique, are not precluded in the present disclosure. Further, the present disclosure may be equally applicable to systems and techniques based on other particles or other particle-like processing agents including neutral particles, photon, and phonon, such as for example, a laser based system and process etc . . . .

In order to avoid confusion, the present disclosure will focus on a plasma based process such as, for example, plasma assisted doping (PLAD) or plasma immersion ion implantation (PIII) system, or plasma enhanced chemical vapor deposition system (PECVD), and systems for performing the same. However, those of ordinary skill in the art will recognize that the present disclosure is not limited to such plasma based systems and processes. In addition, the present disclosure will focus on FinFET substrate having a plurality of surface sections, where one of the surface sections is oriented to have greater exposure to particles directed toward the substrate compared to another, different surface section. The former surface section may be oriented across, although not necessarily perpendicular, the path of the particles directed toward the substrate such that the surface section has greater exposure to the particles. The latter surface section, meanwhile, may be oriented along, although not necessarily parallel, the path of the particles such that the latter surface section has less exposure to the particles. Although the present disclosure focuses on FinFET substrate, those of ordinary skill in the art will recognize that the present disclosure will be equally applicable to any type of substrate having surface section oriented at different angles.

Method for Processing a Substrate with Non-Planar Surface

Referring to FIGS. 1a-1d, there is shown a method for processing a substrate with a non-planar surface according to one embodiment of the present disclosure. The method may comprise first to third stages. In one embodiment, the stages may be performed sequentially, where one stage is performed only after completion of another stage. In another embodiment, at least some of the stages may be performed simultaneously. Yet in another embodiment, at least portion of two or more stages may occur concurrently. The order of the stages, in one embodiment, may be specified. In another embodiment, the order of the stages, however, may be unspecified, and the stages may be performed in any order.

During the first stage, a first region of the substrate 100 may be preferentially processed. Herein, the first surface section may be a surface section that has highest exposure to the particles or processing agent incident on the substrate. In one embodiment where the particles are incident at an angle perpendicular or substantially perpendicular to the substrate, the first surface section may be horizontally extending section 102, and the first region 102a may be a region under the horizontally extending section 102. Meanwhile, the second surface section may be vertically extending section 104, and the second region may be a region 104a adjacent to the vertically extending section 104. In another embodiment, the first surface section may be the vertically extending section 104, and the first region may be a region 104a adjacent to the vertically extending section 104. Meanwhile, the second surface section may be the horizontally extending section 102, and the second region may be a region 102a under the horizontally extending section 102. For purpose of clarity and simplicity, the method will be described made in context to the former embodiment. Accordingly, the first surface section herein may refer to the horizontally extending surface section, and the region under the horizontally extending surface section will be referred to as the first region.

Figure 1B:
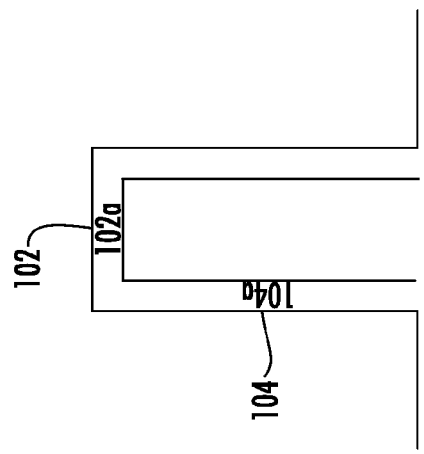

The process that may be performed during the first stage, in one embodiment, may be a doping process. In addition, the doping may be performed via, for example, an ion implantation process. In performing the doping process, as shown in FIG. 1b, the first region 102a may be implanted with dopant until a desired dopant level is achieved. In the present disclosure, the desired dopant level may be in the range of approximately $1 \times 10^5$ dopant/cm$^2$ to approximately $1 \times 10^{30}$ dopant/cm$^2$. In addition, the first region 102a may be implanted at a desired depth. The energy of the particles implanted may be in the range of approximately 5 KeV to approximately 15 KeV. If a plasma based system, such as PLAD system, is used to perform the first stage, the desired dopant depth may be controlled by adjusting the bias applied to the substrate. If a system, such as beam-line ion implantation system, is used, the dopant depth may be controlled by adjusting acceleration or deceleration of the particles directed toward the substrate. The dopant depth may also be controlled by adjusting the temperature of the substrate through, for example, annealing process.

In some embodiments, the first stage may process the first surface section 102 and first region 102a more completely than the second surface section 104 and second region 104a. For example, in a doping process, first region 102a may be implanted with a desired dose of dopant, while second region 104a may receive little or no implanted dopants.

Figure 1C:
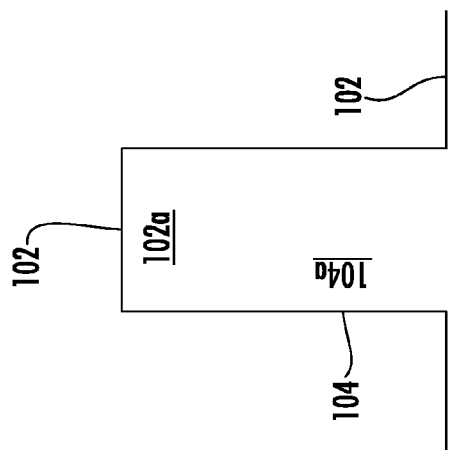
Figure 1D:
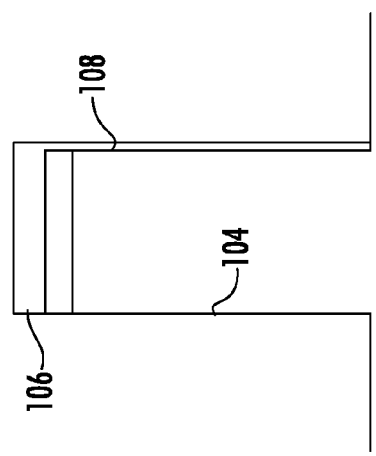

The method of the present disclosure may also comprise a second stage. In one embodiment, the second stage may be performed after the first stage. In another embodiment, the first and second stages may be performed simultaneously. Yet in another embodiment, the second stage may be performed prior to the first stage. The process that may be performed during the second stage, in the present embodiment, may be a deposition process. In another embodiment, however, the second process technique may be another, different type of process. During the second stage, as shown in FIG. 1c, a thin film 106 may be formed on the first surface section 102. Although a thin film 108 may also be formed on the second surface section 104, the rate of the film 108 formed on the second surface section 104 may be less than the rate of the film 106 formed on the first surface section L. Accordingly, if a film 106 and 108 is formed on both the first and second sections 102 and 104, respectively, the film 106 formed on the first section 102 may be thicker than that formed on the second section 104. The second stage may continue until the thickness of the film 106 formed on the first surface section 102 is greater than 80 Å. In another embodiment, the second stage may continue until the thickness of the film 106 formed on the first surface section 102 is approximately 10 times greater or more than that of the film 108 formed on the second surface section 104. Yet in another embodiment, the second stage may continue until a film 106 with sufficient thickness to prevent or limit the first surface section 102 and first region 102a from further processing during the third stage, as described below. At the end of the second stage, different surface sections oriented at different angles may have films with different thicknesses.

Figure 2:
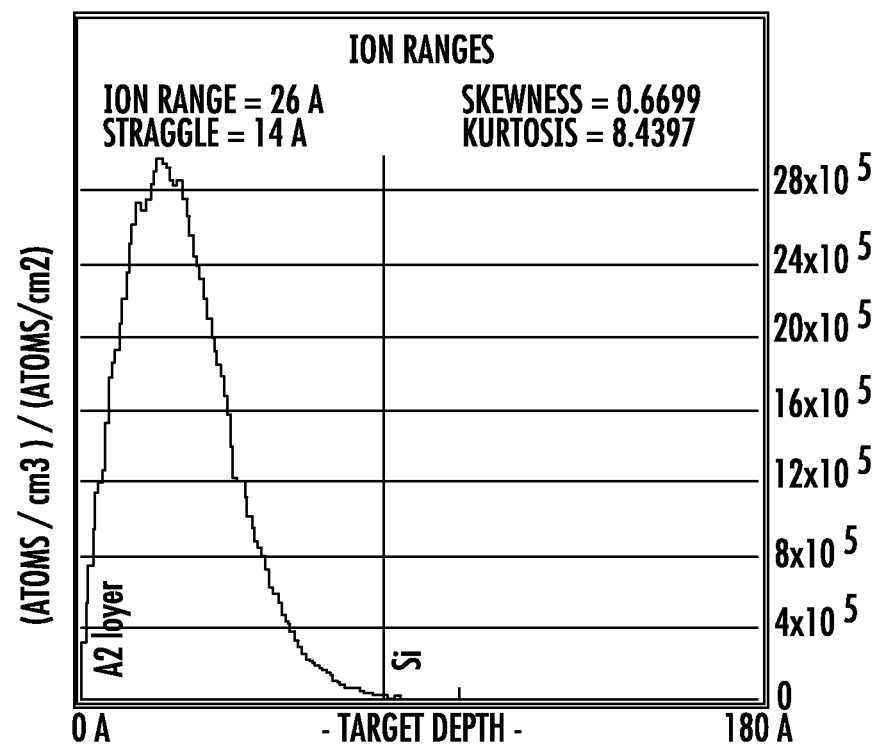
FIG. 2 is a graph showing the thickness of a film containing As required to stop a 1.5 keV implant.

As illustrated in FIG. 2, the thickness of a film containing As required to stop a 1.5 keV implant may be calculated using the code TRIM. FIG. 2 shows that few ions penetrate past a depth of about 80 Å. Thus, a As film of this thickness would be sufficient to limit or prevent further ion implantation of the first region 102a. The thickness that the film formed during the second stage may need to reach may be defined by the process conditions (e.g. particle species and the implant energy) of the third stage, as noted below, and/or the properties (e.g. density or species) of the film formed to prevent or limit further implant during the third stage. Thickness will increase for higher energy and lower film density.

The film formed on the first surface section 102 may contain species that is also contained in the dopant of the first stage. For example, the dopant used in the first stage and the film formed during the second stage may contain arsenic (As), carbon (C), boron (B), gallium (Ga), germanium (Ge), (silicon (Si), or other metallic or non-metallic materials. In another example, the film formed during the second stage may contain none of the species in the dopant implanted during the first stage.

If a plasma based system, such as a PLAD or PECVD system, is used to perform the second stage, low or preferably zero bias is applied to promote formation of the film and/or discourage the implantation of the charged particles into the substrate. In addition, plasma parameters may be adjusted to control the ratio of the thickness of the film formed on the first and second surface sections 102 and 104. For example, the plasma density and the reaction rate may be adjusted. The plasma density may be adjusted by increasing the power applied to plasma source. A detailed description of the adjusting plasma density can be found in co-pending application Ser. No. 11/771,190, No. 12/098,781, and No. 12/105,761, each of which is incorporated in entirety by reference. Meanwhile, the reaction rate may be adjusted by increasing the RF power applied to plasma source or, alternatively, by increasing the concentration of the film precursor introduced to the system.

The method of the present disclosure may also comprise a third stage. In the third stage, the second surface section 104, on which a film has not been formed or on which a film having less thickness is formed, is preferentially processed. In the present embodiment, the third stage may be the same or similar to the first stage. As such, if the first stage is an implantation process, for example, the third stage may also be an implantation process. In addition, dopant implanted during the first and third stages may contain the same or different species.

As the particles are incident upon the second surface section 104, the region 104a is processed. Meanwhile, the film 106 formed on the first surface section 102 may prevent or alternatively limit the surface section 102 and first region 102a from being further processed. The first surface section 102 and first region 102a may, therefore, be prevented from being implanted with particles and processed. Alternatively, the first surface section 102 may be implanted with dopants at a rate much lower that the rate by which the second surface section 104 is implanted. By preventing or limiting particle implantation on the first surface section 102 with the film and promoting particle implantation on the second surface section 104 and second region 104a, wide variation in dopant level, implantation depth, or other results among different surface sections that otherwise would occur may be avoided or corrected.

Figure 3:
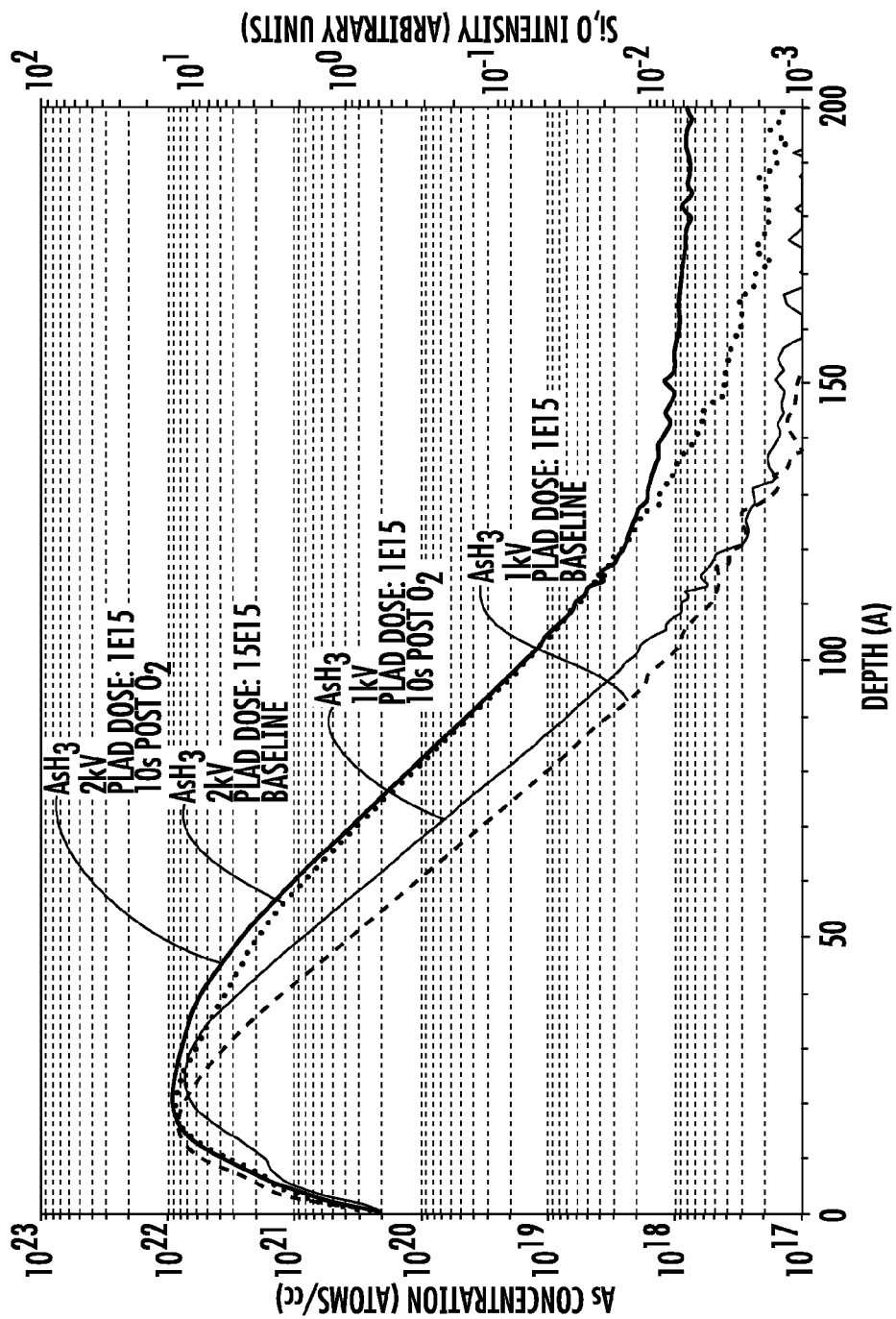
FIG. 3 is a graph showing the effect of oxygen treatment on retained dose of $AsH_3$ implants.

The method described in the present disclosure may have an optional chemical or plasma treatment stage. During the optional stage, the film deposited on one or more surface sections may be exposed to atoms, molecules, or plasma containing oxygen (e.g. $O_2$, $O_3$, $H_2O$), and the film may be oxidized. Alternatively, the film may be exposed to atoms, molecules, or plasma containing nitrogen (e.g. $N_2$ or $NH_3$) and cause nitridation of the film. Yet in another example, the film may be exposed to another gaseous species and chemically react with the gaseous species. By modifying the film, the volatility of the material deposited on the substrate may be reduced. In addition, the film may be chemically modified during the stage to improve solubility and to enable post implant stripping. An example of $O_2$ plasma treatment and its effects on As retained dose and implant profile is given in FIG. 3. In this example, the concentration of As increases at almost all depths after a 10 second exposure to an oxygen treatment.

In the present embodiment, the process condition and parameters of the first to third stages, and the optional modification stage, may be different. As noted above, implantation of the particles is preferably avoided during the second stage.

Figure 4:
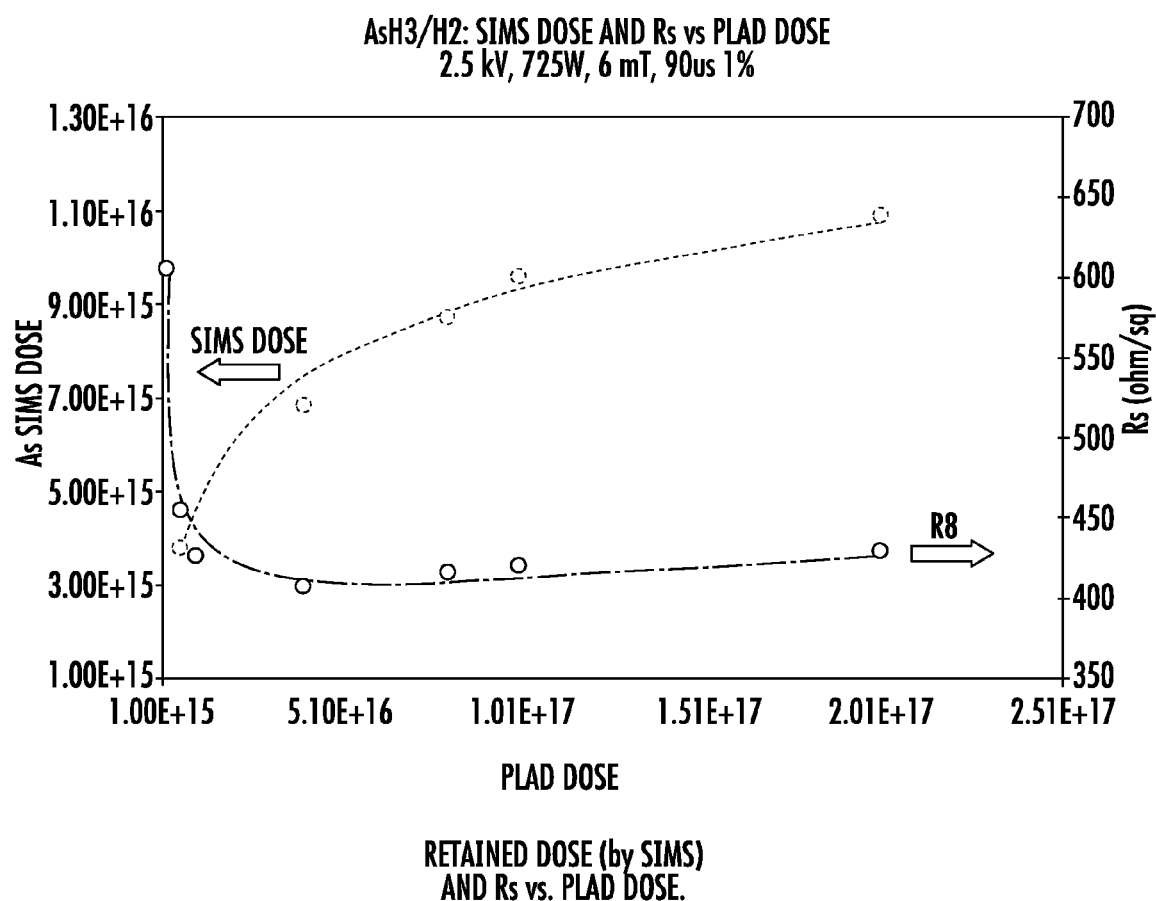
FIG. 4 is a graph showing the relationship between retained dose and series resistance vs. dose for $AsH_3$ implants.
Figure 5:
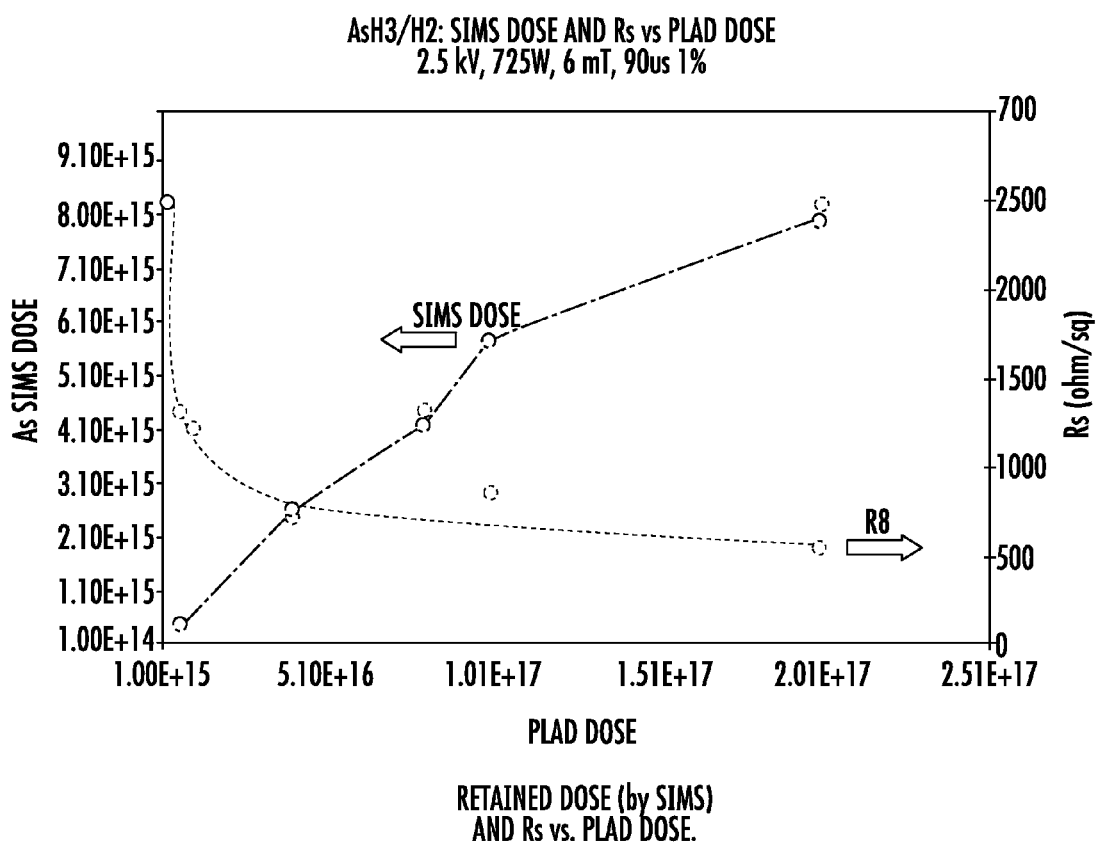
FIG. 5 is a graph showing the relationship between retained dose and series resistance vs. dose for $AsH_2$ implants.

During the third stage, however, minimum deposition or sputtering may be preferred. Deposition of the film during the stage may prevent particles from being implanted at desired surface section. Meanwhile, sputtering may remove the region containing previously implanted dopants. Examples of processes where the doping increases as a function of PLAD dose is illustrated in FIGS. 4 and 5. In the embodiment where the first to third stages are plasma based process, the process conditions including RF power applied to the plasma source and/or the substrate, energy, gas composition, diluent gas, duty factor, etc . . . may be adjusted to center the plasma doping process in the required regime. The use of a multi set-point RF generator and/or ramped voltage described in co-pending application Ser. No. 11/771,190, No. 12/098,781, No. 12/105,761, and No. 11/376,522, each of which is incorporated in its entirety by reference.

In the present disclosure, each stage may continue until desired properties are achieved. In the embodiment where the first and third stages relate to dopant implantation and the second stage relate to film formation, each stage may continue until desired implant dose or film thickness is achieved. Each stage end point may be detected by monitoring particle dose, process time as determined by process characterization and calibration, or a signal (e.g. optical signal) received from the substrate itself or the chamber.

The process sequence described above is an exemplary one. Depending on the requirements of the specific application, the order of the steps described above may be changed. In addition, each individual stage may be repeated, and a set of stages may be repeated. Further, the process conditions may be adjusted depending on the application and the geometry of the structure to achieve optimal results.

For example, the method for processing a substrate with a non-planar surface may be used to efficiently dope trenches of a dynamic random access memory (DRAM) capacitor structure. In this example, the trench may have a dimension of 100 nm opening and 4000 nm depth. To dope the trenches, the structure may be implanted with As at an high implant energy (e.g. equal to greater than 10 kV). The system used in this exemplary embodiment may be PLAD system or a beam-line ion implanter. During the first stage, ions having sufficient implant energy may be incident on the trench walls at shallow angles. Portion of the ions incident on the walls on the trench may bounce from the surface, and the entire depth of the trench may be uniformly doped. During the optional chemical or plasma treatment stage, the film may be exposed to $O_2$ plasma. The treatment stage may reduce the volatility of the material deposited on the wafers and facilitates post processing.

Exemplary System

Figure 6:
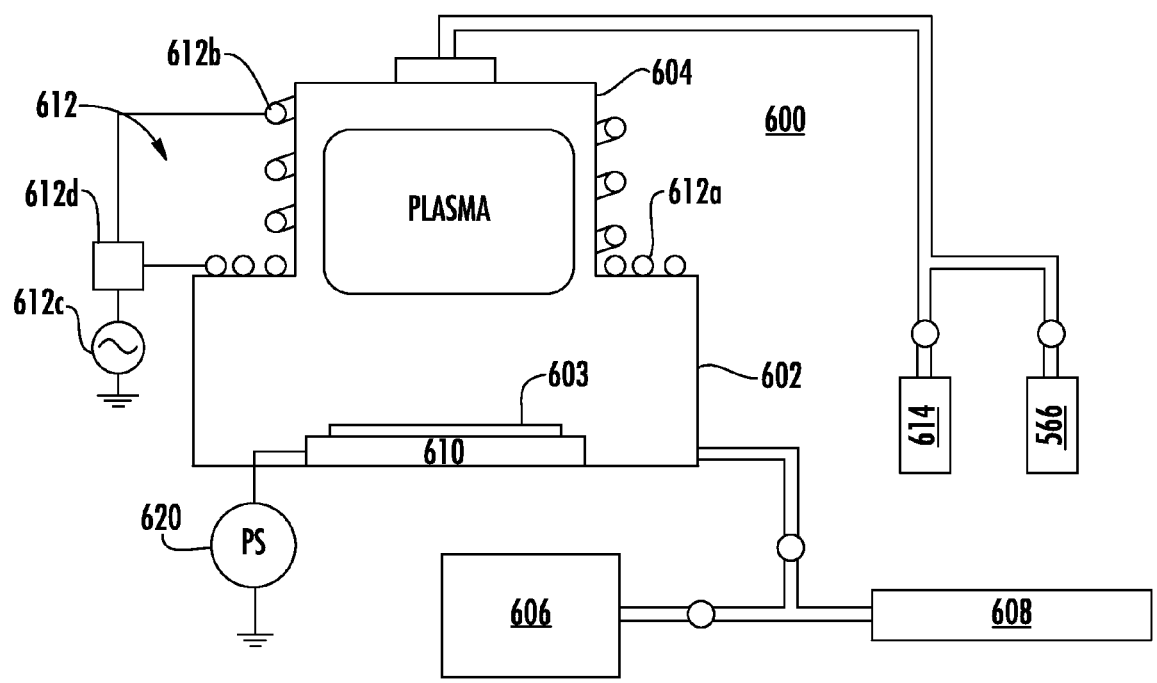
FIG. 6 represents a system for processing a substrate according to one embodiment.

Referring to FIG. 6, there is shown an exemplary system for processing a substrate having a non-planar surface according to one embodiment of the present disclosure. The system 600 disclosed herein may be a stand alone system. Alternatively, the system 600 may be a part of a cluster tool including one or more systems 600, one or more substrate monitoring systems, one or more other types of substrate processing systems, and one or more transferring systems for transferring the substrate between different systems.

The system 600 may comprise a process chamber 602, which is typically capable of a high vacuum base pressure with, for example, a turbo pump 606, a mechanical pump 608, and other necessary vacuum sealing components. Inside the process chamber 602, there may be a platen 610 that supports at least one substrate 603. The platen 610 may be equipped with one or more temperature management devices to adjust and maintain the temperature of the substrate 603. Tilting or rotation of the substrate 603 may also be accommodated to align the substrate with background magnetic field. A bias source 620 may be electrically coupled to the platen 610, thus the substrate 603, applying a bias voltage to the substrate 603. The bias may be applied by providing continuous or pulsed, RF or DC current. If the bias source 620 provides RF current, an impedance matching network (not shown) may be provided between the bias source and the platen 610. In the present embodiment, the bias source 620 may be capable of adjusting and varying the bias applied to the substrate 603 during operation. For example, the bias source 620 may ramp up or down, continuously or in steps, the bias applied to the substrate 603 during operation.

The process chamber 602 may also be equipped with one or more in situ monitoring systems. For example, one or more temperature monitoring system may be included in the processing system 602 to monitor the temperature of the substrate and/or environment temperature. The chamber 602 may also be equipped with magnetic field monitoring systems (not shown) capable of monitoring the background magnetic field and/or the process integrity.

The system 600 may also comprise a plasma chamber 604 which may be either coupled or spaced apart, hence remote, from the process chamber 602. The plasma chamber may also include a plasma source 612 for generating high or low density plasma. For example, the plasma chamber 604 may include an inductively coupled plasma (ICP) source, a capacitively coupled plasma (CCP) source, a microwave (MW) source, a glow-discharge (GD) source, or a helicon source, or a combination thereof. If the plasma chamber 604 is equipped with ICP source, the system 600 may comprise at least one of planar and helical coils 612a and 612b, a power source 612c electrically coupled to one or both of the coils 612a and 612b, and an impedance matching network 612d. If the system 600 is equipped with CCP source, the system 600 may comprise at least one electrode (not shown) positioned such that the substrate 602 is interposed between the electrode and the platen 610. A power source 612c may also be included to electrically couple the electrode and the platen 610. Further, the power source 612c may be coupled to an impedance matching network 612d. If the system 600 is equipped with GD source, the system 600 may comprise at least one electrode (not shown) positioned such that the substrate 602 is interposed between the electrode and the platen 610. In addition, a power source 612 may be electrically coupled to the electrode and the platen 610.

Depending on the type of the plasma source 612, the power source may be RF power source or DC power source. For example, if the plasma source 612 is either ICP or CCP source, the power source may be RF power source. However, if the plasma source 612 is GD source, the power source 612 may be DC source. If the plasma source is CCP source, the power source 612c may provide high frequency RF current in the range of 30 to 200 MHz. However, RF current with other frequencies may also be used. If the plasma source 612 is ICP source, RF current provided by the power source 612c may be that in the range of 1 to 30 MHz. However, RF current with other frequencies may also be used. If the plasma source 612 is MW source, the RF current may be in the range of 0.3 to 300 GHz. However, RF current with other frequencies may also be used. The power source 612 may provide continuous or pulsed current. A detailed description of a system with an ICP plasma source can be found in a co-pending application Ser. No. 10/905,172, which is incorporated in its entirety by reference.

In one embodiment, the power source 612c providing the power to the plasma source (e.g. coil or electrode) may also be the bias source providing bias to the platen 610. For example, the system 600 may comprise a single power source to activate both the platen and at least one of the coils (or the electrode). However, the system 600 may preferably comprise two or more power sources, at least one power source activating the coil or electrode of plasma source and at least one another activating the platen of the processing chamber.

The system 600 may also include one or more process gas sources 614 and one or more dilutant gas sources 616. In the present disclosure, the process gas source 614 may contain species including boron (B), phosphorous, or As. The process gas source 614 may contain other species. One or more dilutant source 616 may contain species including helium, neon, argon, krypton, xenon, radon, oxygen, or nitrogen or other gases.

As noted above, the system 600 described herein may be a stand alone system 600. Alternatively, the system 600 may be a part of a cluster tool containing one or more processing and/or monitoring systems. If the system 600 is a part of a cluster tool, the cluster tool may include a transfer mechanism to transfer the substrate to and from various processing and/or monitoring systems to sequentially perform various processes without introducing the substrate to open atmosphere.

Figure 7:
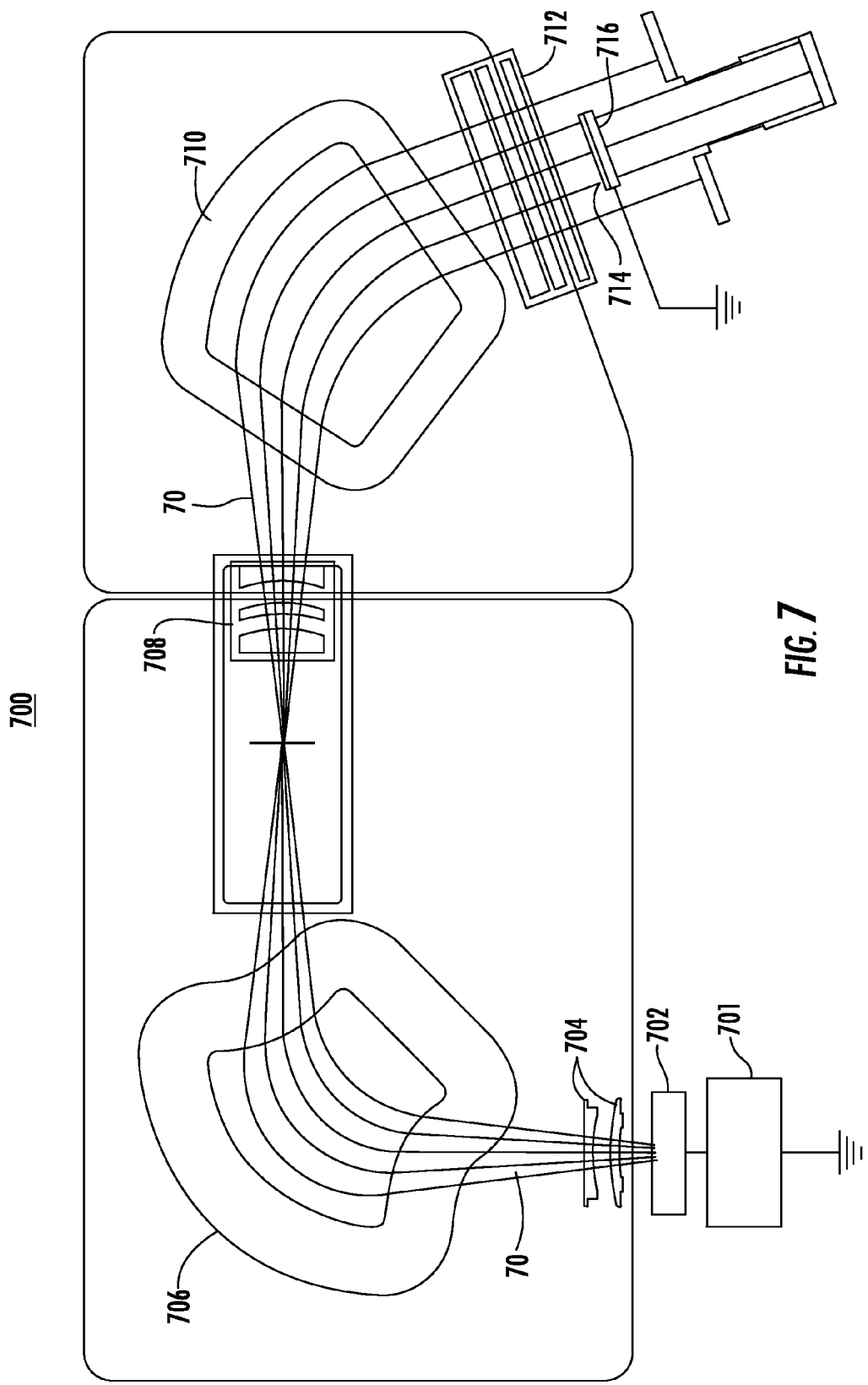
FIG. 7 represents a system for processing a substrate according to a second embodiment.

Referring to FIG. 7, there is shown an exemplary system for processing a substrate having a non-planar surface according to one embodiment of the present disclosure. In this embodiment, a beam-line ion implanter is shown. The ion implanter may include an ion source 702 for generating ions. The ion implanter 700 may also comprise a series of beam-line components through which ion beam 706 passes. Examples of the beam-line components may include extraction electrodes 704, a magnetic mass analyzer 706, a plurality of lenses 708, a beam parallelizer 710, and acceleration/deceleration stage 712. The ion implanter 700 may also include a platen 716 supporting the wafer 714 to be implanted. The wafer 714, meanwhile, may be moved in one or more dimensions (e.g., translate, rotate, and tilt) by a component, sometimes referred to as a "roplat" (not shown).

During implantation, the ions of desired species, such as hydrogen ions, are generated and extracted from the ion source 702. Thereafter, extracted ions 707 travel in a beam-like state along the beam-line components and implanted to the wafer 714. Much like a series of optical lenses that manipulate a light beam, the beam-line components manipulate the ion beam 707. The ion beam 707 manipulated by the beam-line components is directed.

A novel method and system for processing a substrate having non-planar surface is disclosed. As noted above, the system and the method may be applicable in manufacturing or processing various types of substrate including FinFETs or DRAMs. Although the present disclosure has been described herein in the context of particular embodiments having particular implementation in a particular environment for a particular purpose, those of ordinary skill in the art will recognize that its usefulness is not limited thereto and that the present disclosure may be beneficially implemented in any number of environments for any number of purposes. Various changes in form and detail may be made without departing from the spirit and scope of the invention as defined herein. Accordingly, the claims set forth below should be construed in view of the full breadth and spirit of the present disclosure as described herein.

What is claimed is:

1. A method of processing a substrate comprising:
performing a first stage of implanting ions of desired species into first and second surfaces of the substrate, the first surface extending in a horizontal direction relative to a plane of the substrate and the second surface extending in a vertical direction relative to the plane of the substrate, wherein amount of the ions of desired species implanted into the first surface is greater than the amount of ions implanted into the second surface;
performing a second stage of depositing a first film having a first thickness on the first surface of the substrate;
performing a third stage of implanting the ions of desired species into the second surface of the substrate after the second stage, wherein the amount of the ions of desired species implanted into the second surface during the third stage is greater than the amount of the ions of desired species implanted into the first surface during the third stage; and
depositing a second film having a second thickness on the second surface of the substrate during the second stage.

2. The method according to claim 1, wherein the first thickness is greater than the second thickness.

3. The method according to claim 2, wherein the first thickness is about 80 Å.

4. The method according to claim 2, wherein the first thickness is about ten times greater than the second thickness.

5. The method according to claim 1, wherein the first film contains at least one species chosen from a group consisting of arsenic (As), carbon (C), boron (B), gallium (Ga), germanium (Ge), and silicon (Si).

6. The method according to claim 1, wherein the third stage is performed after the first stage.

7. A method of processing a substrate in a plasma based system, the substrate comprising a first surface extending in a horizontal direction relative to a plane of the substrate and a second surface extending in a vertical direction relative to the plane of the substrate, the plasma based system comprising a process chamber, a plasma source, a platen disposed within the process chamber, and a bias source, the method comprising:
introducing the substrate into the process chamber;
generating in the process chamber plasma containing ions of desired species;
applying a first bias to the substrate and implanting a first dose of the ions into a first region of the substrate adjacent to the first surface and a second dose of the ions into a second region of the substrate adjacent to the second surface, wherein the first dose is greater than the second dose;
applying a second bias to the substrate and depositing a first film having a first thickness on the first surface; and
applying a third bias to the substrate and implanting third dose of the ions into the first region and a fourth dose of the ions into the second region, wherein the fourth dose is greater than the third dose.

8. The method according to claim 7, further comprising:
depositing a second film having a second thickness on the second surface of the substrate while depositing the first film.

9. The method according to claim 8, wherein the first thickness is greater than the second thickness.

10. The method according to claim 8, wherein the first thickness is about 80 Å.

11. The method according to claim 9, wherein the first thickness is about ten times greater than the second thickness.

12. The method according to claim 7, wherein the first film contains at least one species chosen from a group consisting of arsenic (As), carbon (C), boron (B), gallium (Ga), germanium (Ge), and silicon (Si).

13. A method of processing a substrate comprising a first surface extending in a horizontal direction relative to a plane of the substrate and a second surface extending in a vertical direction relative to the plane of the substrate, the method comprising:
doping a first region of the substrate adjacent to the first surface and a second region of the substrate adjacent to the second surface with dopants, wherein dose of the dopants in the first region is greater than the dose of the dopants in the second region;
depositing a first film having a first thickness on the first surface of the substrate; and
doping the second region of the substrate after depositing the first film until the dose of the dopants in the second region after depositing the first film is substantially equal to the dopants in the first region after depositing the first film.

14. The method according to claim 13, further comprising:
doping the first region of the substrate after depositing the first film, wherein the second region is doped with greater dose of the dopants after depositing the first film than the first region.

15. The method according to claim 13, further comprising:
depositing a second film having a second thickness on the second surface of the substrate while depositing the first film.

16. The method according to claim 15, wherein the first thickness is greater than the second thickness.

17. The method according to claim 13, wherein the doping the first region and the second region comprises implanting dopants via ion implantation.

* * * * *